US011698502B2

(12) United States Patent
Anderson

(10) Patent No.: US 11,698,502 B2
(45) Date of Patent: Jul. 11, 2023

(54) BRACKET ARRANGEMENT FOR CABLE TROUGH SYSTEM

(71) Applicant: CommScope Technologies LLC, Hickory, NC (US)

(72) Inventor: Scott Jean Anderson, Burnsville, MN (US)

(73) Assignee: COMMSCOPE TECHNOLOGIES LLC, Hickory, NC (US)

(*) Notice: Subject to any disclaimer, the term of this patent is extended or adjusted under 35 U.S.C. 154(b) by 63 days.

(21) Appl. No.: 17/196,799

(22) Filed: Mar. 9, 2021

(65) Prior Publication Data

US 2021/0282294 A1   Sep. 9, 2021

Related U.S. Application Data

(60) Provisional application No. 62/987,163, filed on Mar. 9, 2020.

(51) Int. Cl.
G02B 6/44 (2006.01)
H02G 3/04 (2006.01)
H05K 7/14 (2006.01)

(52) U.S. Cl.
CPC ......... *G02B 6/4459* (2013.01); *G02B 6/4439* (2013.01); *H02G 3/0437* (2013.01); *H02G 3/0456* (2013.01); *H05K 7/1491* (2013.01)

(58) Field of Classification Search
CPC .. H02G 3/0437; H02G 3/0456; H05K 7/1491; H04Q 1/06; H04Q 1/064; G02B 6/4459
See application file for complete search history.

(56) References Cited

U.S. PATENT DOCUMENTS

| 4,723,749 | A  | * | 2/1988  | Carraro ..................... E04B 9/18 52/39 |
| 5,937,131 | A  |   | 8/1999  | Haataja et al. |
| 6,412,733 | B1 | * | 7/2002  | Grzemski ............ H02G 3/0437 248/235 |
| 6,631,874 | B2 | * | 10/2003 | Turpin ................. G02B 6/4459 248/235 |
| 7,210,270 | B1 | * | 5/2007  | King .................... H02G 3/0425 52/239 |
| 7,789,359 | B2 | * | 9/2010  | Chopp, Jr. ........... H02G 3/0456 248/210 |
| 2008/0175554 | A1 | * | 7/2008 | Coburn ................ G02B 6/4459 385/136 |
| 2010/0278500 | A1 | * | 11/2010 | Campos ............... G02B 6/4439 385/135 |
| 2014/0341523 | A1 | * | 11/2014 | Waite ................... G02B 6/4459 385/136 |

(Continued)

OTHER PUBLICATIONS

Vertically Adjustable FiberGuide (FGS) Support Bracket, CommScope, Inc., admitted as prior art as of Mar. 9, 2020 (1 pg).

(Continued)

*Primary Examiner* — Michael Stahl
(74) *Attorney, Agent, or Firm* — Merchant & Gould P.C.

(57) ABSTRACT

A bracket system mounts to a ladder rack for positioning a fiber trough system above the ladder rack. The bracket arrangement includes a bridge with a slider bar that allows for multiple positions of the fiber trough system relative to the ladder rack in a horizontal direction.

19 Claims, 11 Drawing Sheets

(56) References Cited

U.S. PATENT DOCUMENTS

2015/0214703 A1* 7/2015 Larsen .................. H02G 3/045
174/97

OTHER PUBLICATIONS

Fibre Cable Raceway Systems, ADC/Krone, dated Jul. 2006 (69 pgs.).
Fiber Cable Management Products, Second Edition, ADC Telecommunications, dated Oct. 1995 (149 pgs).
FiberGuide Fiber Management Systems, ADC Telecommunications, dated Jun. 1998 (37 pgs.).

* cited by examiner

BRACKET ARRANGEMENT FOR CABLE TROUGH SYSTEM

CROSS-REFERENCE TO RELATED APPLICATION

This application claims priority to U.S. Provisional Patent Application Ser. No. 62/987,163, filed on Mar. 9, 2020, the disclosure of which is hereby incorporated by reference in its entirety.

BACKGROUND

Telecommunications cables are sometimes managed above telecommunications equipment in ladder racks or in fiber trough systems. The ladder racks or fiber trough systems allow the cables to be routed between various pieces of equipment in different parts of a room, for example. There is a need for continued improvement for managing telecommunications cables or other cables.

SUMMARY

A bracket system is provided for mounting to a ladder rack for positioning a fiber trough system above the ladder rack. The bracket arrangement includes a bridge which mounts to the ladder rack. The bridge includes two upright portions to space an upper portion of the bridge at a spaced apart distance from an upper surface of the ladder rack.

The bridge arrangement includes a top slider bar positionable in multiple positions relative to the bridge arrangement between a position centrally located over the ladder rack, and at least one position shifted away from a central location toward a side location relative to the ladder rack.

Cables can be routed in the ladder rack or the fiber trough system.

The bridge arrangement includes two legs and a crossbar connecting the two legs. The legs each include ends. Each end includes an inside tab and an outside tab for engaging a portion of one of the ladder rack rails. Threaded posts, holes, and threaded knobs allow for the tabs to be tightened or loosened relative to the rails of the ladder rack.

The slider bar includes a C-shape in cross section with side edges that surround the edges of the crossbar. The slider bar is allowed to slide relative to the crossbar for multiple positions over the ladder rack. Fasteners are utilized to connect the bridge arrangement to a lateral trough section. One fastener includes a threaded portion and a flange, or T-bar, received in a slot of the crossbar, the slider bar, and the fiber trough portion.

DETAILED DESCRIPTION

Figure 1:
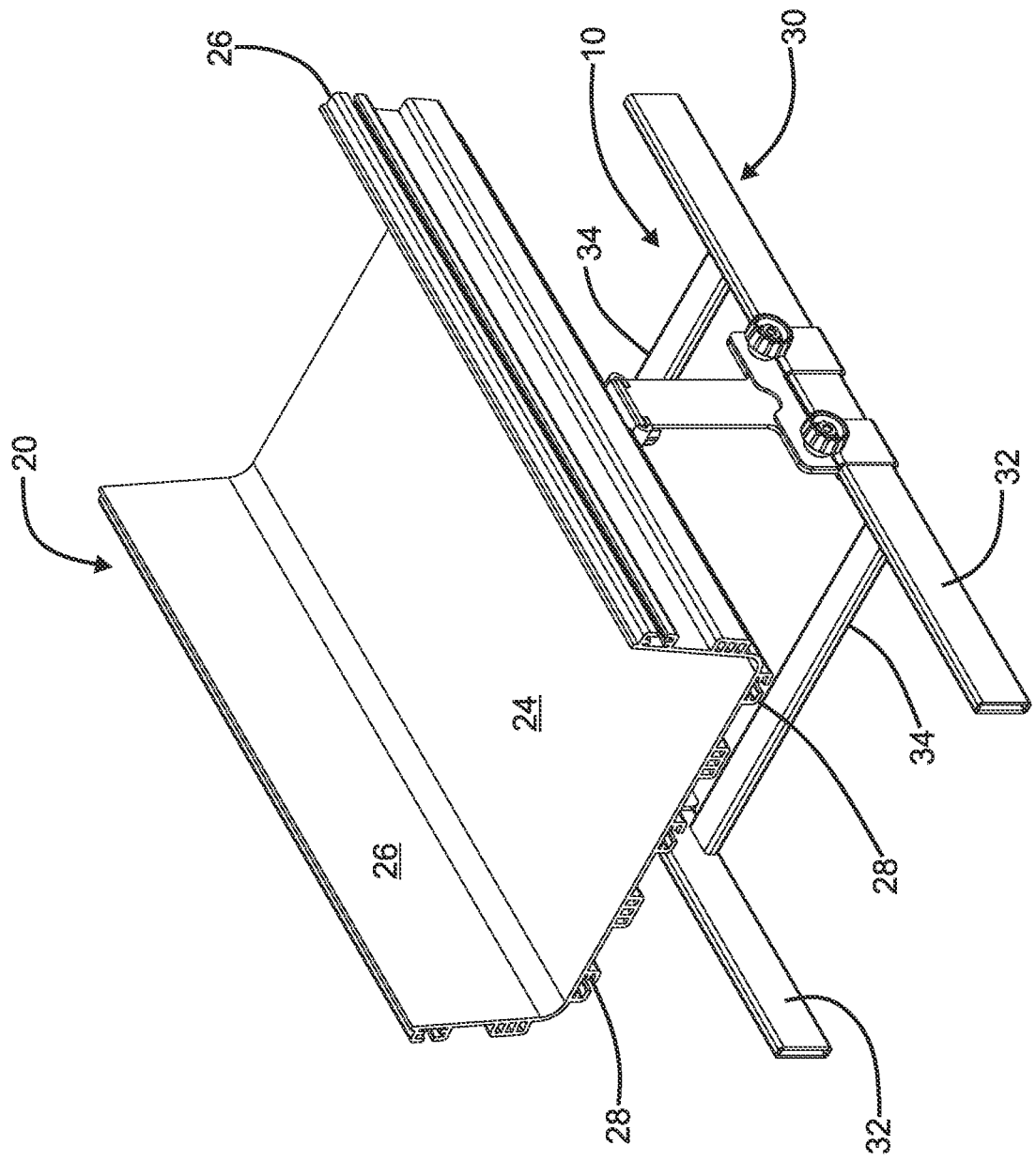
FIG. 1 is a top perspective view of a portion of a ladder rack, a bridge arrangement, and a portion of a lateral trough section of a fiber tough system.
Figure 2:
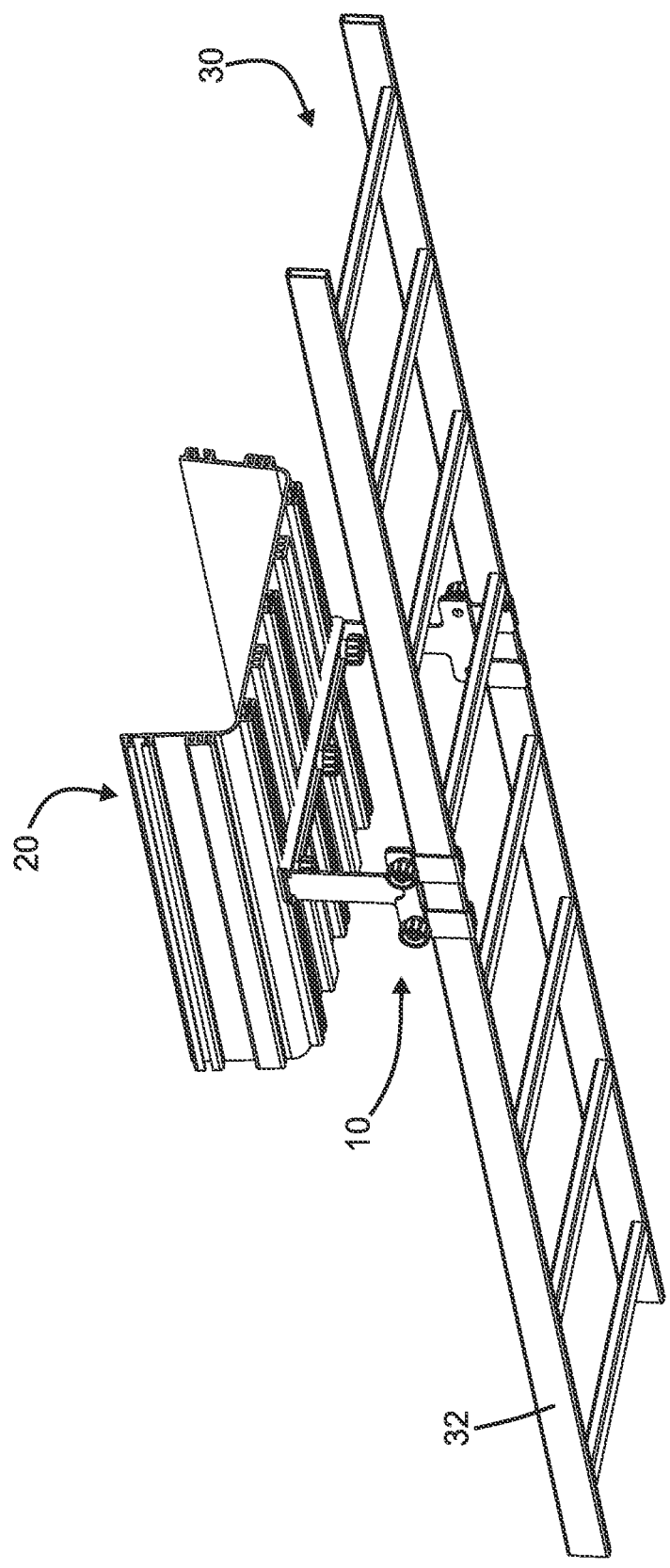
FIG. 2 is a bottom perspective view showing further portions of a ladder rack, the bridge arrangement, and a portion of the lateral trough section of FIG. 1.
Figure 3:
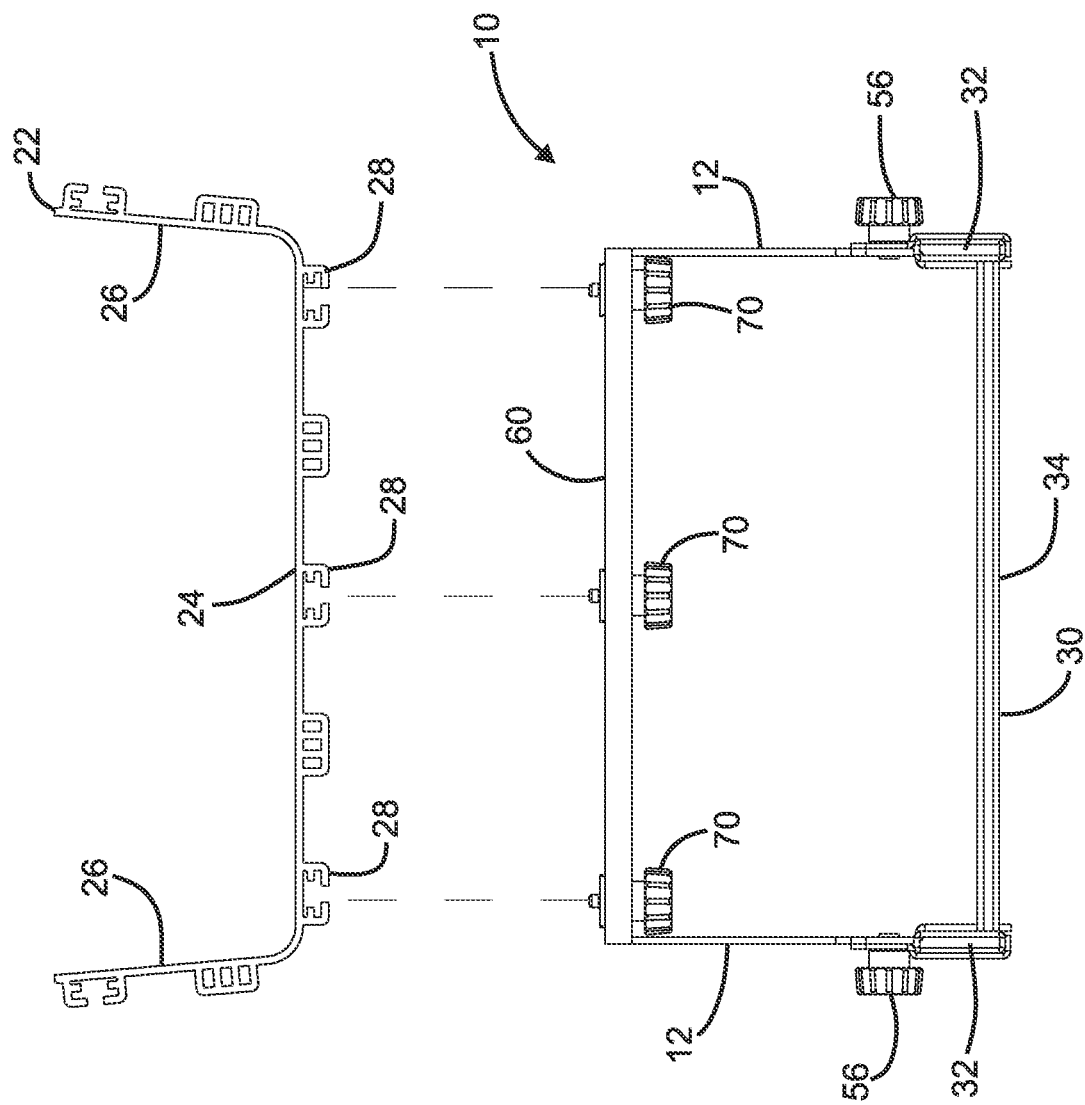
FIG. 3 is an end view of the ladder rack, the bridge arrangement, and a lateral trough section in exploded view from that shown in FIGS. 1 and 2.
Figure 4:
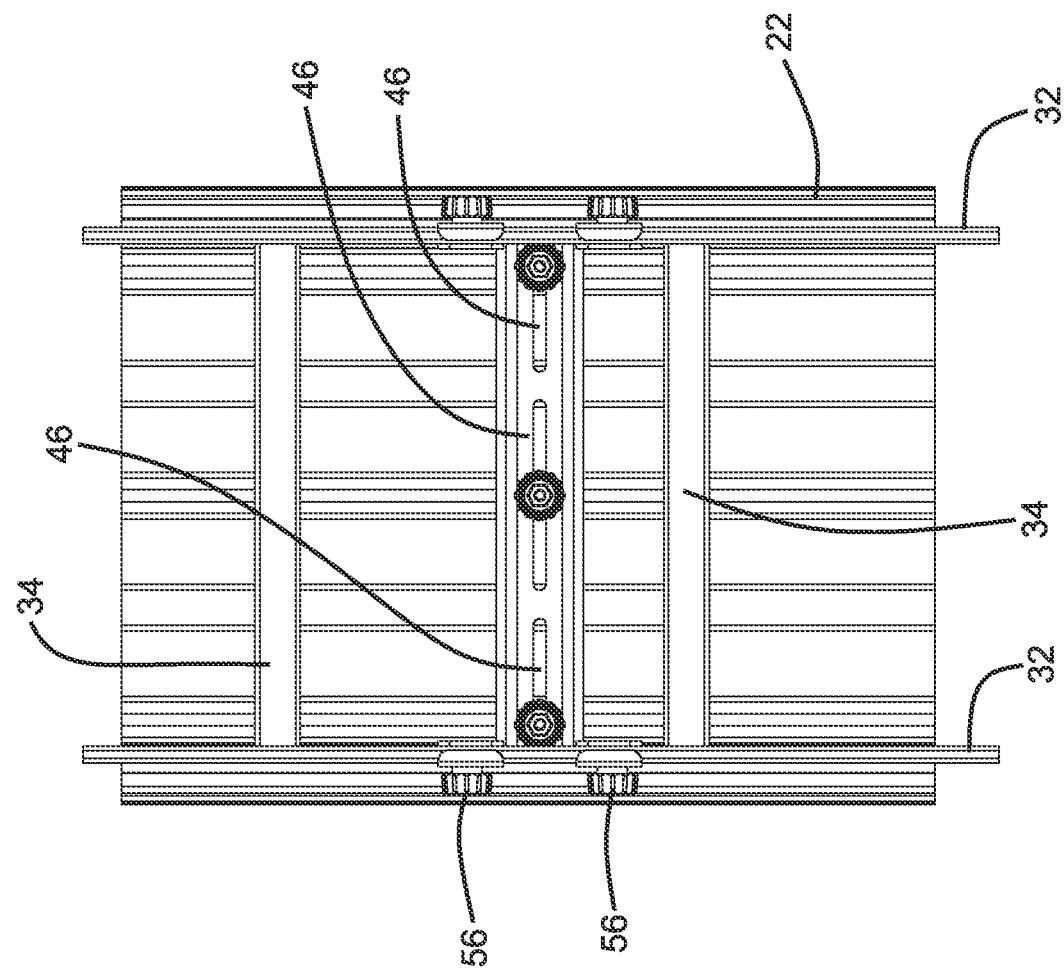
FIG. 4 is a bottom view of the ladder rack, the bridge arrangement, and the lateral trough section of FIGS. 1-3.
Figure 5:
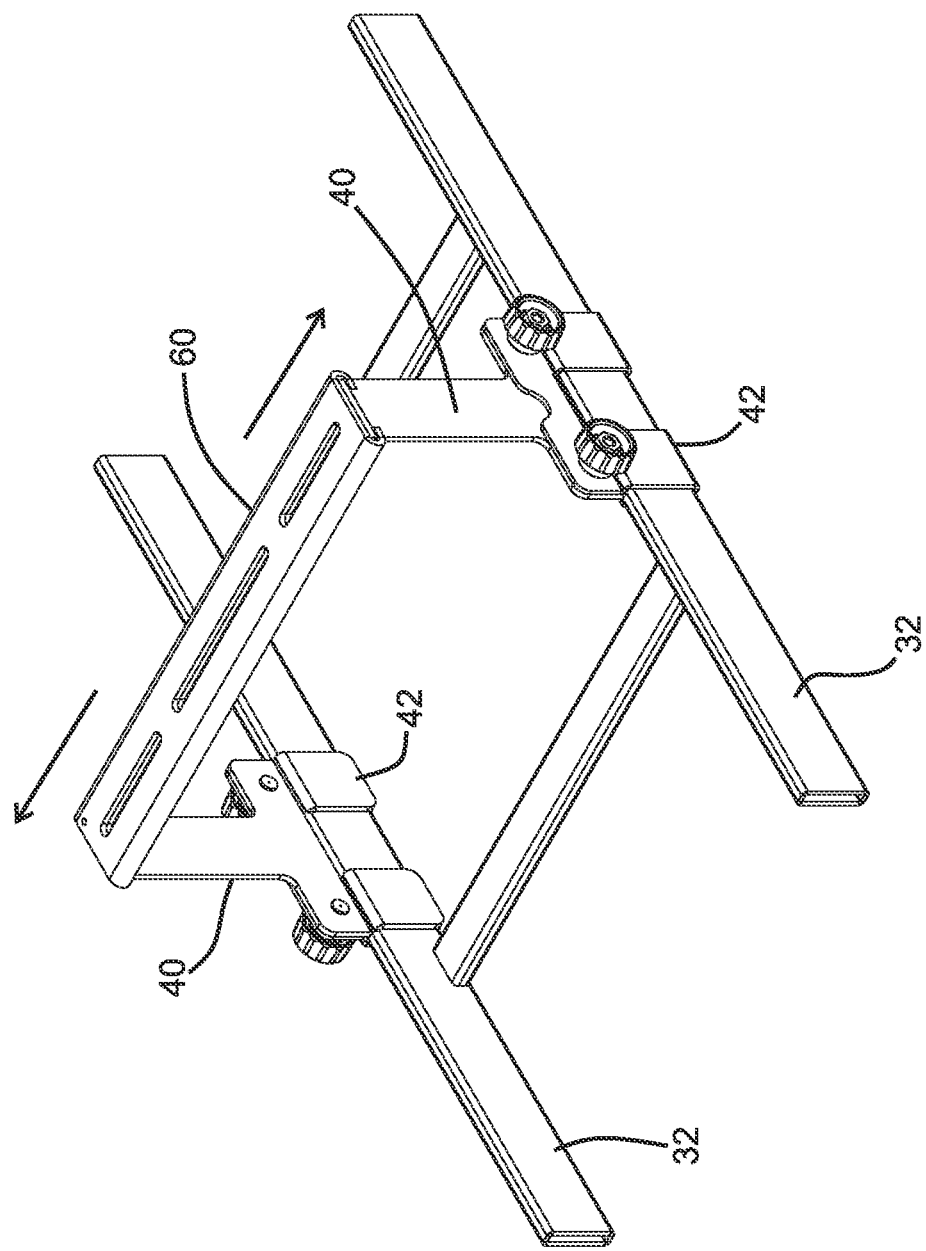
FIG. 5 is a top perspective view of the bridge arrangement and the ladder rack of FIG. 1.

Referring now to FIGS. 1-14, a bracket system 10 is provided for mounting a fiber trough system 20 to a ladder rack 30. The ladder rack 30 typically includes rails 32 and a plurality of rack crossbars 34. Only a small section of an example ladder rack 30 is shown in the figures.

The ladder rack 30 typically extend near the ceiling over telecommunications equipment 100 allowing for cables 90 to be routed between equipment located in the same room or in different rooms. The cables can be telecommunications cables, power cables, or hybrid cables. In the case of telecommunications cables, the cables can be copper cables, such as twisted pair or coaxial, or fiber optic cables.

The ladder rack 30 is typically horizontally arranged and can include straight sections, elbows, crosses, tees, and downspouts. There can also be transitions downwardly and upwardly.

There is a need in some situations to add a cable trough system 20 above a ladder rack 30. As shown, cable trough system 20 is a fiber trough system. Only a portion of a lateral trough section 22 is shown. Each lateral trough section includes a base 24, a pair of upright sides 26, and exterior slots 28.

The fiber trough system 20 can include straight sections, elbows, crosses, tees, downspouts, and elevational changing elements.

In the examples of FIGS. 1-14, both the ladder rack 30 and the fiber trough system 20 are straight sections mounted in a horizontal orientation. When mounted as such with the bracket system in place, both the ladder rack 30 and the fiber trough system 20 can be utilized to mount different cables. For example, power cables and copper cables can be positioned over the rack crossbars 34 of the ladder rack 30. Fiber optic cables can be placed in the fiber trough system 20.

In one example, a fiber exit trough allows fibers 90 to transition from the lateral trough section 22 toward equipment 100 located below both the fiber trough system 20, and the ladder rack 30. See for example U.S. Pat. No. 5,937,131, the disclosure of which is incorporated by reference, which shows an example of a fiber exit trough.

The ladder rack 30 can be mounted to structures below the ladder rack 30 to support the ladder rack 30 at an elevated location. Also, structures extending from the ceiling downward can also mount the ladder rack 30 at the elevated location.

The bracket system 10 includes an arrangement 12 with two upright portions or legs 40 having ends 42 which mount to rails 32 of ladder rack 30. A crossbar 44 is positioned at the top of legs 40 to form a bridge structure over ladder rack 30.

Ends 42 include inside tabs 50, outside tabs 52, threaded posts 54 that pass through holes 55, and threaded knobs 56. Outside tabs 52 include a lip 58. The combination of the inside tabs 50, and the outside tabs 52 along with the threaded posts 54 and threaded knobs 56 capture a portion of rails 32 to secure each end 42 of the bridge arrangement to ladder rack 30.

As shown, crossbar 44 includes a plurality of longitudinal slots 46. A slider bar 60 is positioned in interlocking arrangement with crossbar 44. Slider bar 60 also includes a plurality of longitudinal slots 66. Crossbar 44 includes side edges 48. Slider bar 60 includes side edges 68 having a curved configuration to surround an interlock with side edges 48 of crossbar 44. In this manner, slider bar 60 is slidable relative to crossbar 44 between a central position and either an offset position to one side or the other of the bridge arrangement 12.

A stop can be provided with respect to slider bar 60 so that once positioned on crossbar 44, slider bar 60 does not slide all the way off and separate from crossbar 44. Such an arrangement can be a small set screw or a bent portion of the sliding portions located at an appropriate location to prevent separation.

Figure 14:
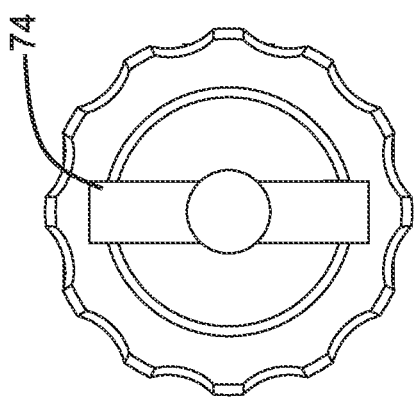
FIGS. 12-14 show a fastener including a knob with a threaded inner portion, and a threaded post with a flange, or T-bar, for receipt in a slot of the crossbar, the slider bar, and the lateral trough.
Figure 13:
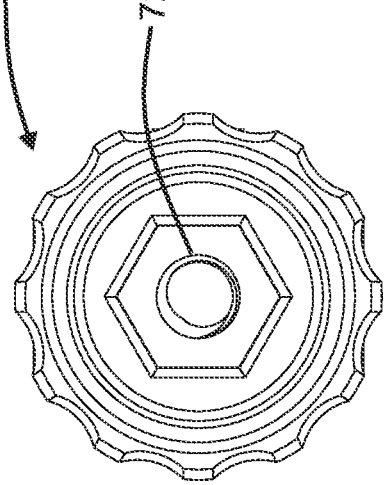
Figure 12:
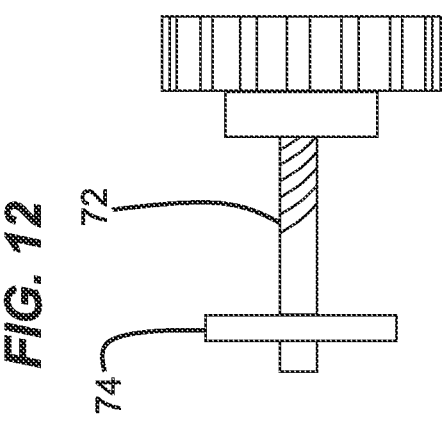

Connection knobs 70 are utilized to engage slots 28 of lateral trough 22 wherein the connectors also pass through at least one of the slots of slider bar 60 and/or crossbar 44. FIGS. 12-14 show a fastener or connection knob 70 of the type useful to attach to lateral trough 22, including a threaded portion 72 and a flange, or T-bar 74, for receipt in a slot of the crossbar, a slot of the slider bar, and slot 28 of the lateral trough 22.

Figure 6:
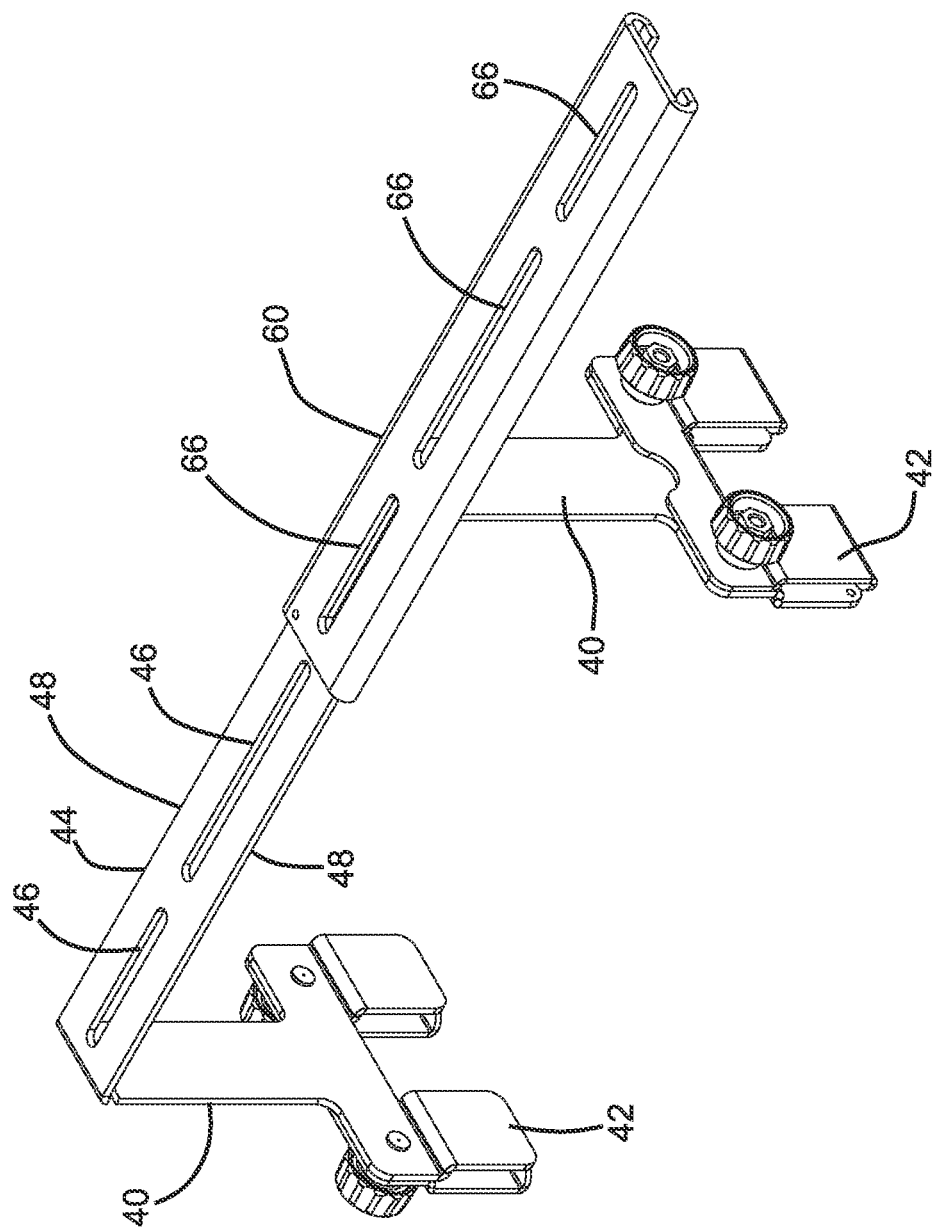
FIG. 6 is a top perspective view of the bridge arrangement of FIGS. 1-5, showing a slider bar in an offset position relative to the crossbar of the bridge arrangement.
Figure 7:
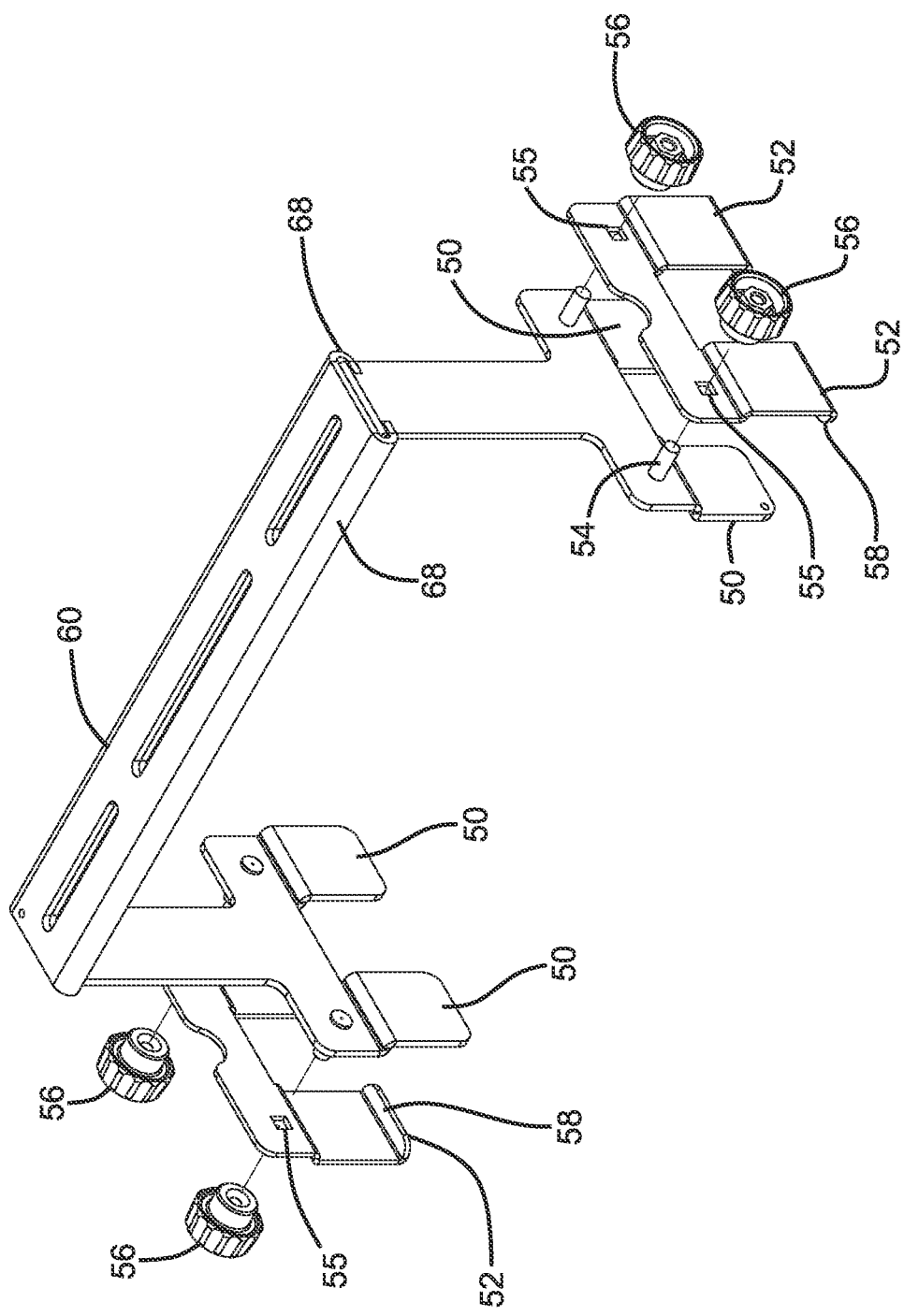
FIG. 7 shows the bridge arrangement with the mounting ends shown in exploded view which mount the bridge arrangement to rails of the ladder rack.
Figure 9:
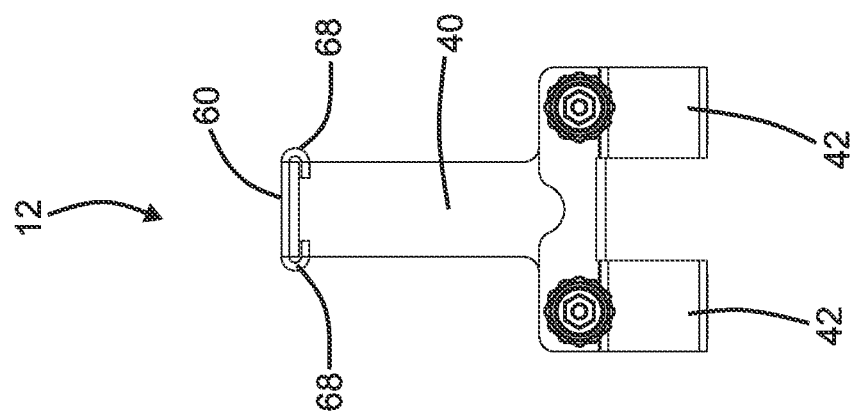
FIG. 9 shows a side view of the bridge arrangement.
Figure 8:
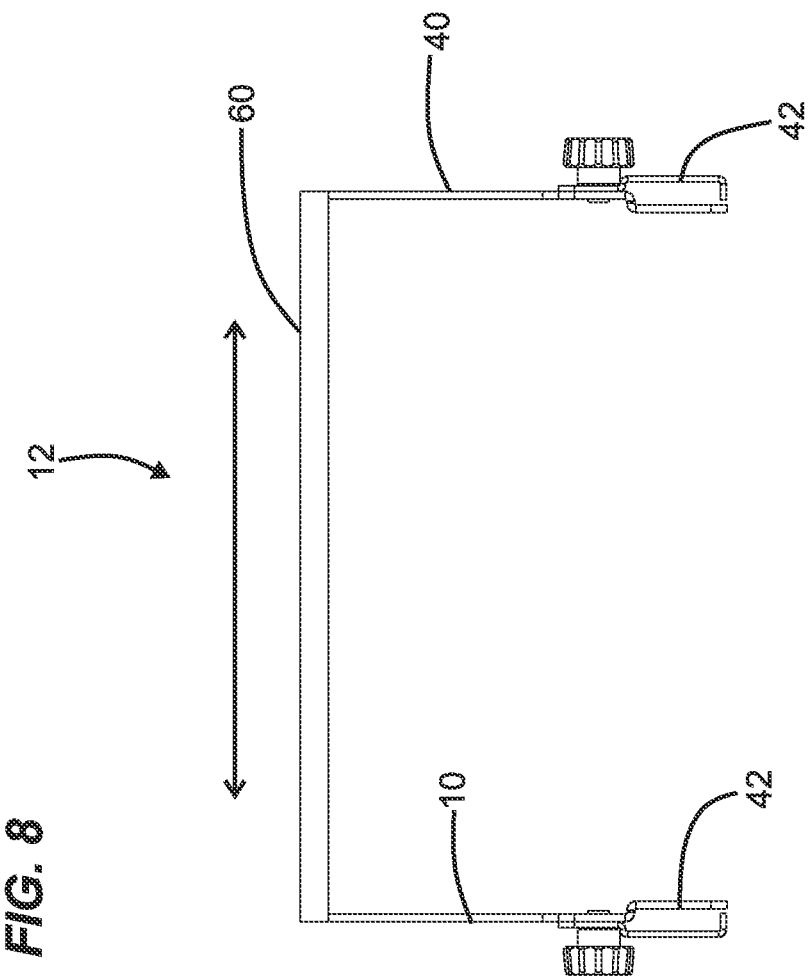
FIG. 8 shows an end view of the bridge arrangement.
Figure 10:
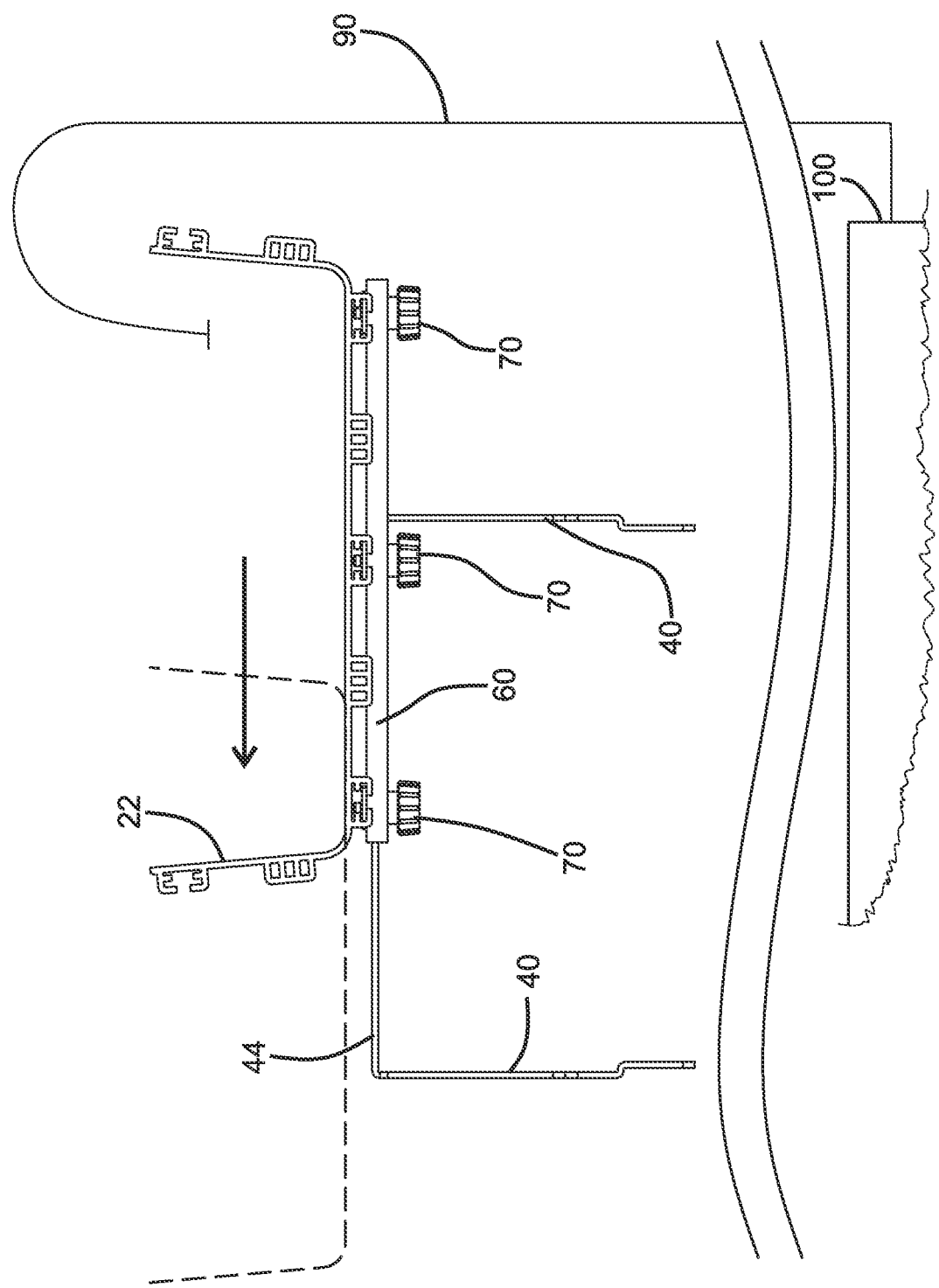
FIG. 10 shows a portion of the bridge arrangement mounted to a lateral trough section where the lateral trough section is offset from the bridge arrangement.
Figure 11:
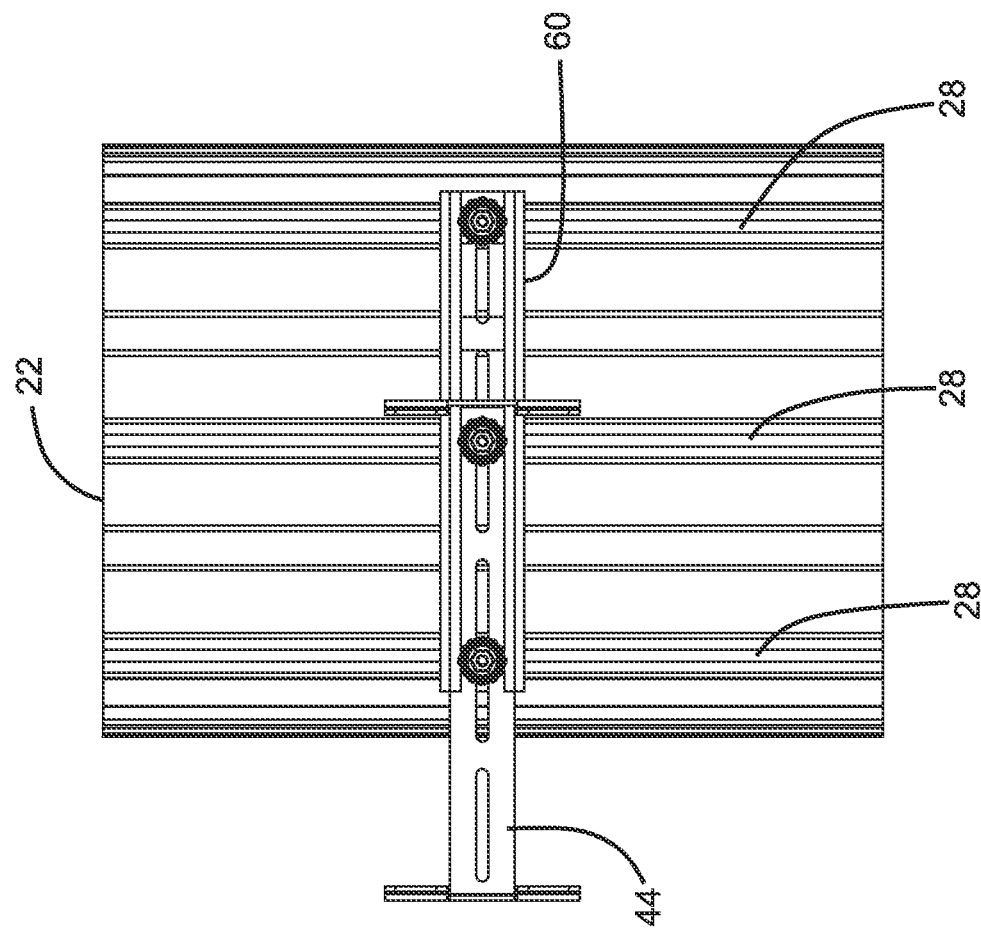
FIG. 11 is a bottom view of the bridge arrangements and lateral trough in the offset position.

As shown in FIGS. 6, 10 and 11, slider bar 60 can be mounted offset relative to crossbar 44 to allow for offset mounting of lateral trough 22 relative to ladder rack 30, so as to better position lateral trough 22 over the equipment 100 located below.

Bracket system 10 is provided for mounting a fiber trough system 20 to a ladder rack 30 in selectable positions. For example, the bracket system 10 can centrally mount the fiber trough system 20 to the ladder rack 30, if desired, in one preferred embodiment. The bracket system 10 can laterally mount the fiber trough system 20 to the ladder rack 30, to better position the lateral trough or the equipment.

The illustrated systems allow for different cable types to be segregated from one another. For example, fiber cables and be placed in the cable trough system 30, and power cables or copper telecommunications cables can be placed on ladder rack 20. Other arrangements are possible.

What is claimed is:

1. A bracket system for mounting to a ladder rack comprising:
   a bracket arrangement including a bridge including two legs and a crossbar connecting the two legs;
   wherein each leg includes an end mountable to a rail of the ladder rack;
   a slider bar slidably mounted to the crossbar for mounting in multiple lateral positions;
   a mounting arrangement for mounting a lateral trough section to the slider bar, and
   wherein the slider bar is mountable to the crossbar in a desired lateral position.

2. The bracket system of claim 1, wherein the crossbar has two side edges, and wherein the slider bar includes a C-shape with side edges that surround the two edges of the crossbar.

3. The bracket system of claim 1, wherein the crossbar and the slider bar include longitudinal slots for receiving fasteners.

4. The bracket system of claim 1, further comprising a ladder rack including two side rails, and a plurality of crossbars extending therebetween.

5. The bracket system of claim 1, further comprising a lateral trough section mounted to the slider bar.

6. The bracket system of claim 1, wherein the slider bar includes a stop arrangement which prevents the slider bar from completely sliding off of the crossbar when activated.

7. The bracket system of claim 1, further comprising fasteners with T-shaped arms for passing through the crossbar and the slider bar and into the lateral trough section.

8. The bracket system of claim 1, further comprising:
   a ladder rack including two side rails, and a plurality of crossbars extending therebetween;
   a lateral trough section mounted to the slider bar; and
   fiber cables in the lateral trough section, and other cables in the ladder rack.

9. The bracket system of claim 2, wherein the crossbar and the slider bar include longitudinal slots for receiving fasteners.

10. The bracket system of claim 9, further comprising a ladder rack including two side rails, and a plurality of crossbars extending therebetween.

11. The bracket system of claim 10, further comprising a lateral trough section mounted to the slider bar.

12. The bracket system of claim 11, wherein the slider bar includes a stop arrangement which prevents the slider bar from completely sliding off of the crossbar when activated.

13. The bracket system of claim 12, further comprising fasteners with T-shaped arms for passing through the crossbar and the slider bar and into the lateral trough section.

14. The bracket system of claim 13, further comprising fiber cables in the lateral trough section, and other cables in the ladder rack.

15. A cable management system comprising:
   a ladder rack including two side rails, and a plurality of ladder crossbars extending therebetween;
   a bracket arrangement including a bridge including two legs and a crossbar connecting the two legs;
   wherein each leg includes an end mountable to each respective side rail of the ladder rack;
   wherein the crossbar has two side edges;
   a bar mounted to the crossbar for mounting in multiple lateral positions, and wherein the bar includes a C-shape with side edges that surround the two edges of the crossbar;
   a mounting arrangement for mounting a lateral trough section to the bar;
   wherein the bar is mountable to the crossbar in a desired lateral position;
   a lateral trough section mounted to the bar;
   wherein the ladder rack and the lateral trough section each include a longitudinal central cable axis; wherein the longitudinal central cable axis of the lateral trough is offset in a horizontal direction relative to the longitudinal central cable axis of the ladder rack in a selected mounted position.

16. The cable management system of claim 15, wherein the crossbar and the bar include longitudinal slots for receiving fasteners.

17. The cable management system of claim 15, further comprising fasteners with T-shaped arms for passing through the crossbar and the bar and into the lateral trough section.

18. The cable management system of claim 15, further comprising fiber cables in the lateral trough section, and other cables in the ladder rack.

19. The cable management system of claim 15, wherein the crossbar and the bar are slideably mounted to each other in a horizontal direction.

* * * * *

UNITED STATES PATENT AND TRADEMARK OFFICE
CERTIFICATE OF CORRECTION

PATENT NO. : 11,698,502 B2
APPLICATION NO. : 17/196799
DATED : July 11, 2023
INVENTOR(S) : Scott Jean Anderson et al.

It is certified that error appears in the above-identified patent and that said Letters Patent is hereby corrected as shown below:

On the Title Page

Item [12], delete "Anderson" and insert -- Anderson et al. --

At Column 1, Item [72], please add the following inventor:
Ruben Arvilla, Ciudad Juarez, Chihuahua (MX)

Signed and Sealed this
Twenty-sixth Day of November, 2024

Katherine Kelly Vidal
*Director of the United States Patent and Trademark Office*